United States Patent
Tung et al.

(10) Patent No.: US 8,581,252 B2
(45) Date of Patent: Nov. 12, 2013

(54) ACTIVE DEVICE ARRAY SUBSTRATE, COLOR FILTER SUBSTRATE AND MANUFACTURING METHODS THEREOF

(75) Inventors: Yuan-Hung Tung, Taoyuan (TW); Yi-Wei Lee, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/316,875

(22) Filed: Dec. 12, 2011

(65) Prior Publication Data

US 2012/0081809 A1 Apr. 5, 2012

Related U.S. Application Data

(62) Division of application No. 11/533,730, filed on Sep. 20, 2006, now Pat. No. 8,120,028.

(30) Foreign Application Priority Data

Apr. 25, 2006 (TW) .............................. 95114669 A

(51) Int. Cl.
*H01L 29/04* (2006.01)
(52) U.S. Cl.
USPC .................. 257/57; 438/30; 257/E33.054

(58) Field of Classification Search
USPC ........... 257/57, 59, 66, 72, 347, 350, 351, 35, 257/3, 79–103, 918, E51.018–E51.022, 257/E33.001–E33.077, E33.054, E25.028, 257/E25.032; 438/30, 48, 128, 149, 151, 438/157, 161, 283
See application file for complete search history.

(56) References Cited

U.S. PATENT DOCUMENTS

| 7,362,404 B2 * | 4/2008 | Tadaki et al. ................. 349/156 |
| 2003/0025868 A1 * | 2/2003 | Hiroshima et al. ........... 349/156 |

\* cited by examiner

*Primary Examiner* — Tony Tran
(74) *Attorney, Agent, or Firm* — J.C. Patents

(57) ABSTRACT

An active device array substrate comprising a substrate, a pixel array, a partition configuration and an alignment material layer is provided. The substrate has an alignment region and a predetermined sealing region. The predetermined sealing region surrounds the alignment region. The pixel array is disposed on the substrate within the alignment region. The partition configuration is disposed on the substrate between the predetermined sealing region and the alignment region. The alignment material layer is disposed within the alignment region and covers the pixel array.

2 Claims, 22 Drawing Sheets

ACTIVE DEVICE ARRAY SUBSTRATE, COLOR FILTER SUBSTRATE AND MANUFACTURING METHODS THEREOF

CROSS-REFERENCE TO RELATED APPLICATION

This is a divisional application of an application Ser. No. 11/533,730 which is filed on Sep. 20, 2006, now in condition of allowance. The prior application Ser. No. 11/533,730 claims the priority benefit of Taiwan application serial no. 95114669, filed on Apr. 25, 2006. All disclosure of the above-mentioned patent applications is incorporated herein by reference.

BACKGROUND OF THE INVENTION

1. Field of the Invention

The present invention relates to an active device array substrate, a color filter substrate and manufacturing methods thereof. More particularly, the present invention relates to an active device array substrate and a color filter substrate each having a partition configuration and methods of manufacturing the active device array substrate and the color filter substrate each having a partition configuration.

2. Description of Related Art

The popularity of multimedia in our society came as a result of the rapid advancement in the fabrication of semiconductor devices and display apparatuses. In particular, liquid crystal displays, with the advantages of high displaying quality, good spatial utilization, low power consumption, radiation-free operation, have gradually become one of the mainstream products in the market. Typically, each liquid crystal display panel mainly includes two substrates and a liquid crystal layer disposed between the two substrates. In general, each of the two substrates includes an alignment layer whether the display is an active matrix liquid crystal display or a passive matrix liquid crystal display. The main function of the alignment layer is to align the liquid crystal molecules in a specific configuration between the two substrates.

The method of fabricating the alignment layer includes forming an alignment material layer on a thin film transistor array substrate or a color filter substrate after the fabrication of the thin film transistor array substrate or the color filter substrate. Then, an alignment treatment is performed through a rubbing process. For a substrate with a small dimension, the polyimide (PI) coating technique is normally used to transfer the alignment material layer to the surface of the substrate. However, as the dimension of a substrate increases, the coating technique can no longer produce an alignment material layer with a high degree of film surface accuracy. Therefore, an ink jet technique has been developed to resolve the problem of film surface inaccuracy. In the ink jet technique, alignment material is sprayed onto the surface of the substrate. The alignment material layer is formed after the alignment material is diffused and cured.

In the process of using the ink-jet printing method to form the alignment material layer, part of the alignment material layer may cover the common paste due to the difficulty of controlling the diffusion of alignment material near the edges. Therefore, after assembling the color filter substrate or the active device array substrate having an alignment material layer formed by the ink-jet printing method with a counter substrate to form a liquid crystal display panel, the common paste on the color filter substrate or the active device array substrate may form a poor electrically contact with the corresponding common paste on the counter substrate. Ultimately, the displaying quality of the liquid crystal display panel is affected.

SUMMARY OF THE INVENTION

Accordingly, one objective of the present invention is to provide an active device array substrate capable of improving the displaying quality of a liquid crystal display panel.

Another objective of the present invention is to provide a color filter substrate capable of improving the displaying quality of a liquid crystal display panel.

Still another objective of the present invention is to provide a method of fabricating an active device array substrate capable of controlling the region for forming an alignment material layer.

Still yet another objective of the present invention is to provide a method of fabricating a color filter substrate capable of controlling the region for forming an alignment material layer.

To achieve these and other objects and in accordance with the purpose of the invention, as embodied and broadly described herein, the invention provides an active device array substrate. The active device array substrate includes a substrate, a pixel array, a partition configuration and an alignment material layer. The substrate has an alignment region and a predetermined sealing region. The predetermined sealing region surrounds the alignment region. The pixel array is disposed on the substrate within the alignment region. The partition configuration is disposed on the substrate between the predetermined sealing region and the alignment region. The alignment material layer is disposed within the alignment region and covers the pixel array.

According to one embodiment of the present invention, the foregoing active device array substrate further includes an insulation layer disposed on the substrate and extending from the alignment region to the predetermined sealing region. Furthermore, the insulation layer covers the scan lines, the data lines and the active devices.

According to one embodiment of the present invention, in the foregoing active device array substrate, the partition configuration is a concave structure having a width between about 10 μm to 3000 μm and has a depth defined according to the thickness of the insulation layer.

According to one embodiment of the present invention, in the foregoing active device array substrate, the foregoing partition configuration has a depth between about 100 Å to 3000 Å.

According to one embodiment of the present invention, in the foregoing active device array substrate, the partition configuration is a convex structure having a width between about 10 μm to 3000 μm and a height between about 1.5 μm to 4.5 μm.

According to one embodiment of the present invention, the foregoing active device array substrate further includes at least one common paste. The common paste is disposed on the substrate outside the predetermined sealing region and is electrically connected to the pixel array.

According to one embodiment of the present invention, the shortest distance between the foregoing common paste and the predetermined sealing region is greater than or equal to 3000 μm.

According to one embodiment of the present invention, in the foregoing active device array substrate, the pixel array further includes a plurality of scan lines, a plurality of data lines and a plurality of pixel units. Each of the pixel units is electrically connected to one of the scan lines and one of the data lines. Furthermore, each of the pixel units includes an active device and a pixel electrode. The active device is electrically connected to the corresponding scan line and data line. The pixel electrode is electrically connected to the active device.

The present invention also provides a color filter substrate. The color filter substrate includes a substrate, a color filter array, a partition configuration and an alignment material layer. The substrate has an alignment region and a predetermined sealing region. The predetermined sealing region surrounds the alignment region. The color filter array is disposed on the substrate within the alignment region. The partition configuration is disposed on the substrate between the predetermined sealing region and the alignment region. The alignment material layer is disposed inside the alignment region to cover the color filter array.

According to one embodiment of the present invention, in the foregoing color filter substrate, the partition configuration is a convex structure having a width between about 10 μm and 3000 μm and a height between about 1.5 μm and 4.5 μm.

According to the foregoing color filter substrate in one embodiment of the present invention, the partition configuration is a concave structure.

According to one embodiment of the present invention, the color filter substrate further includes at least one common paste. The common paste is disposed on the substrate outside the predetermined sealing region.

According to one embodiment of the present invention, the shortest distance between the foregoing common paste and the predetermined sealing region is greater than or equal to 3000 μm.

According to one embodiment of the present invention, the foregoing color filter array includes a black matrix layer, a plurality of color filter patterns and a common electrode layer. The color filter patterns are disposed between the patterns of the black matrix layer. The common electrode covers the black matrix layer and the color filter patterns and is electrically connected to the common paste.

According to one embodiment of the present invention, the material constituting the foregoing partition configuration is identical to that of the black matrix layer.

The present invention also provides a method of fabricating an active device array substrate. The method of fabricating the active device array substrate includes the following steps. First, a substrate is provided. The substrate has an alignment region and a predetermined sealing region. The predetermined sealing region surrounds the alignment region. Then, a pixel array is formed on the substrate within the alignment region and a partition configuration is formed between the alignment region and the predetermined sealing region. Afterwards, a jet ink printing process is performed so that an alignment material layer is formed over the substrate within the alignment region to cover the pixel array.

According to one embodiment of the present invention, in the method of fabricating an active device array substrate, the formation of the pixel array and the partition configuration includes forming a plurality of scan lines, a plurality of data lines and a plurality of active devices on the substrate within the alignment region. Then, an insulation layer is formed over the substrate to cover the scan lines, the data lines and the active devices. A plurality of contact openings and the aforementioned partition configuration are formed in the insulation layer. Subsequently, a plurality of pixel electrodes are formed on the insulation layer. Each of the pixel electrodes is electrically connected to one of the active devices through one of the contact openings.

According to one embodiment of the present invention, the contact openings and the partition configuration in the foregoing insulation layer are formed simultaneously.

According to one embodiment of the present invention, the method of fabricating the active device array substrate further includes forming at least one common paste on the substrate outside the predetermined sealing region, and the partition configuration is formed between the common paste and the alignment region.

The present invention also provides a method of fabricating a color filter substrate. The method of fabricating the color filter substrate includes the following steps. First, a substrate is provided. The substrate has an alignment region and a predetermined sealing region. The predetermined sealing region surrounds the alignment region. Then, a color filter array is formed on the substrate within the alignment region and a partition configuration is formed between the alignment region and the predetermined sealing region. Afterwards, an ink-jet printing process is performed so that an alignment material layer is formed over the substrate within the alignment region to cover the color filter array.

According to one embodiment of the present invention, in the method of fabricating the color filter substrate, the formation of the color filter array and the partition configuration includes forming a black matrix layer on the substrate within the alignment region and forming a partition configuration between the alignment region and the predetermined sealing region. After that, a plurality of color filter patterns are formed between the patterns of the black matrix layer. Next, a common electrode layer is formed over the substrate to cover the black matrix layer and the color filter patterns.

According to one embodiment of the present invention, the foregoing black matrix layer and the partition configuration are formed simultaneously.

According to one embodiment of the present invention, in the method of fabricating the color filter substrate, the formation of the color filter array and the partition configuration includes forming a black matrix layer on the substrate within the alignment region. Then, a plurality of color filter patterns are formed between the patterns of the black matrix layer and a partition configuration is formed between the alignment region and the predetermined sealing region. After that, a common electrode layer is formed over the substrate to cover the black matrix layer and the color filter patterns.

According to one embodiment of the present invention, the method of fabricating the color filter substrate further includes forming at least one common paste on the substrate outside the predetermined sealing region, so that the partition configuration is formed between the common paste and the alignment region.

In the active device array substrate or color filter substrate, according to one embodiment of the present invention, the partition configuration restricts the region for forming the alignment material layer so that the alignment material layer does not cover the common paste. After assembling the active device array substrate or the color filter substrate with a counter substrate to form a liquid crystal display panel, the circuit on the active device array substrate or color filter substrate can electrically conduct with the circuit on the counter substrate through the common paste. Therefore, the liquid crystal display panel has better displaying quality. In other words, the active device array substrate or color filter substrate is able to improve the displaying quality of the liquid crystal display panel. In addition, the method of fabricating the active device array substrate or the method of fabricating the color filter substrate according to the present invention also includes the fabrication of a partition configuration. Through the partition configuration, the region for forming the alignment material layer is controlled to prevent the alignment material layer from covering the common paste.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
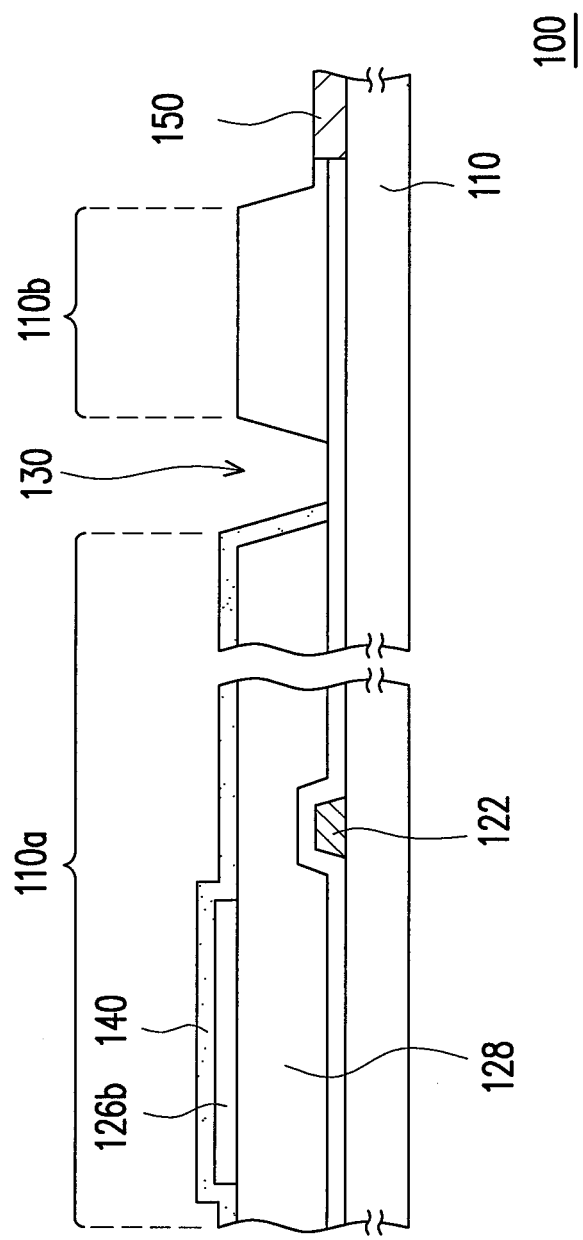
FIG. 1A is a schematic cross-sectional view showing the structure of an active device array substrate according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
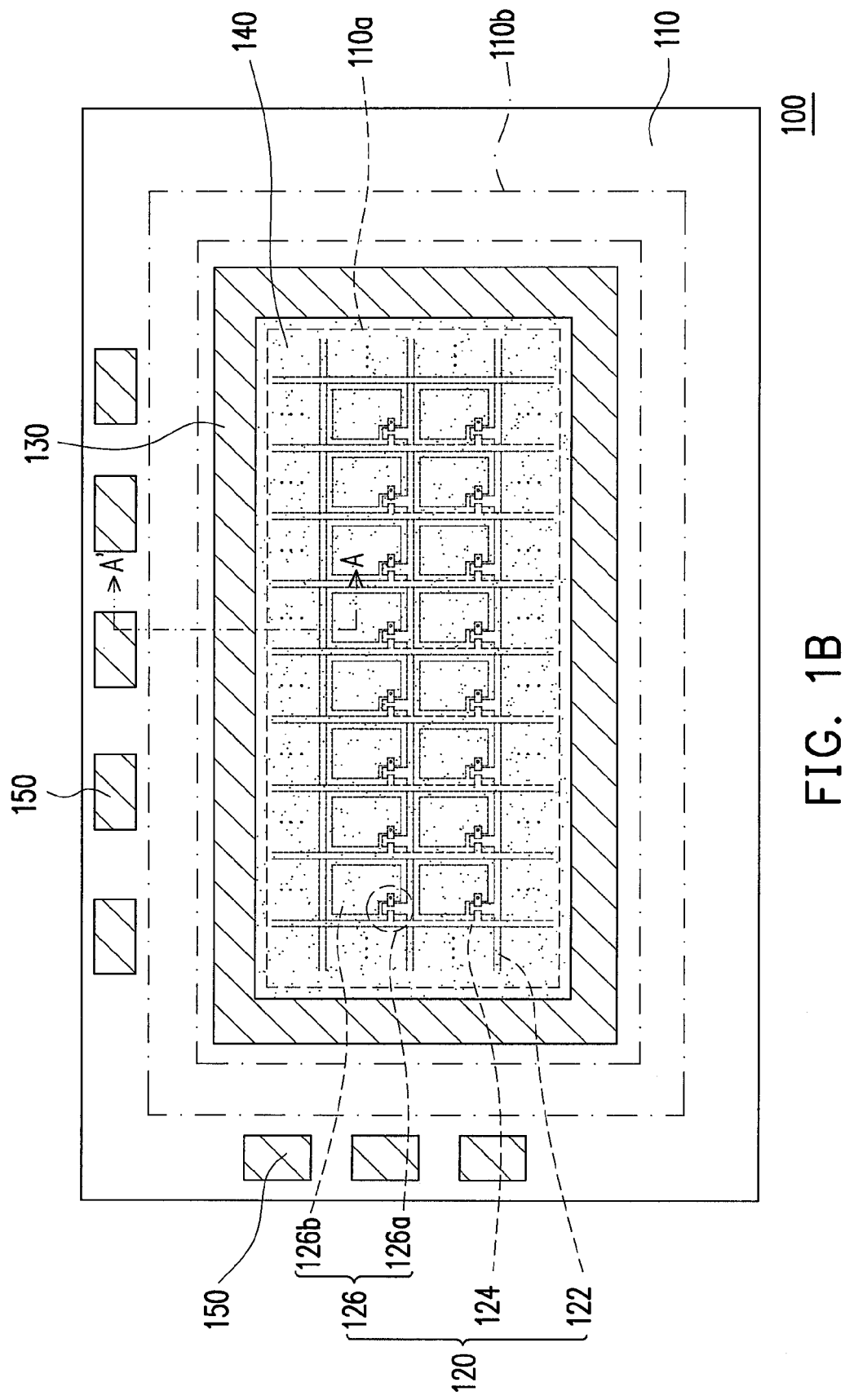
FIG. 1B is a top view of the active device array substrate in FIG. 1A.

FIG. 1A is a schematic cross-sectional view showing the structure of an active device array substrate according to one embodiment of the present invention. FIG. 1B is a top view of the active device array substrate in FIG. 1A. In fact, FIG. 1A is a cross-sectional view along line A-A' of FIG. 1B. As shown in FIGS. 1A and 1B, the active device array substrate 100 includes a substrate 110, a pixel array 120, a partition configuration 130 and an alignment material layer 140. The substrate 110 is, for example, a glass substrate, a quartz substrate, or other substrate made of a suitable material. The substrate 110 has an alignment region 110a and a predetermined sealing region 110b. The predetermined sealing region 110b surrounds the alignment region 110a. The pixel array 120 is disposed on the substrate 110 within the alignment region 110a. The partition configuration 130 is disposed on the substrate 110 between the predetermined sealing region 110b and the alignment region 110a. The alignment material layer 140 is disposed within the alignment region 110a to cover the pixel array 120.

As shown in FIG. 1B, the pixel array 120 includes a plurality of scan lines 122, a plurality of data lines 124 and a plurality of pixel units 126. Each of the pixel units 126 is electrically connected to one of the scan lines 122 and one of the data lines 124. Furthermore, each of the pixel units 126 includes an active device 126a and a pixel electrode 126b. The active device 126a is electrically connected to the corresponding scan line 122 and data line 124. The pixel electrode 126b is electrically connected to the active device 126a.

The scan lines 122 are conductive lines fabricated using aluminum alloy or other suitable conductive material, for example. The data lines 124 are conductive lines fabricated using chromium, aluminum alloy or other suitable conductive material, for example. The active devices 126a are, for example, thin film transistors or other three-terminal switching devices. The pixel electrodes 126b are, for example, transmissive electrodes, reflective electrodes or transflective electrodes. The material constituting the pixel electrodes 120b includes indium tin oxide (ITO), indium zinc oxide (IZO), metals, or other transparent or non-transparent conductive materials.

Figure 2A:
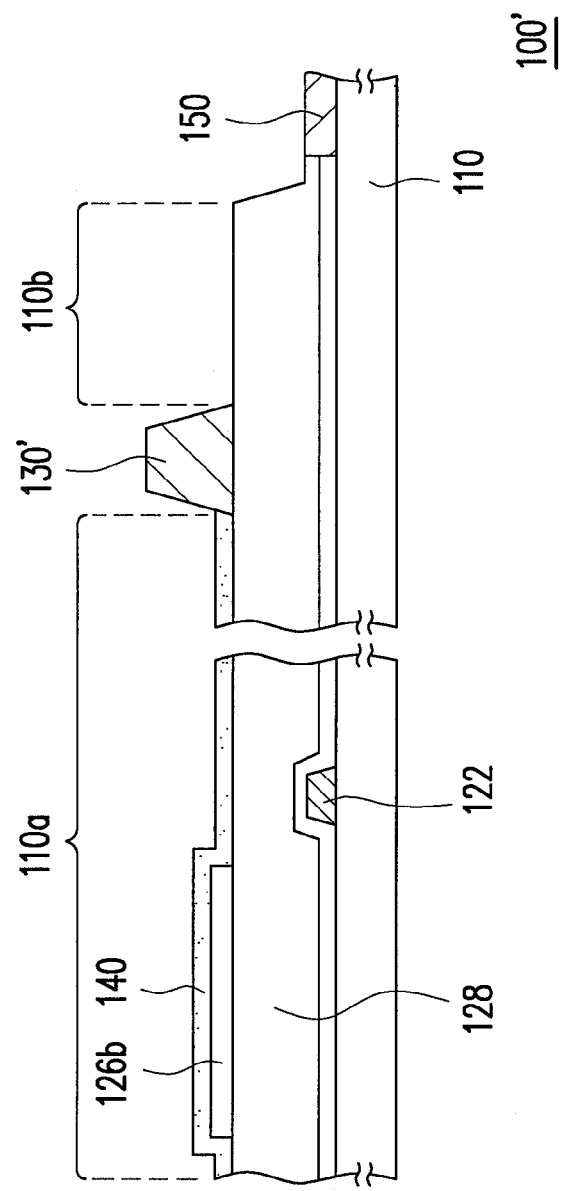
FIGS. 2A and 2B are schematic local cross-sectional view and top view of an active device array substrate according to a different embodiment of the present invention.

In the present embodiment as shown in FIG. 1A, the active device array substrate 100 further includes an insulation layer 128. The insulation layer 128 is disposed on the substrate 110 and extends from the alignment region 110a to the predetermined sealing region 110b. The insulation layer 128 covers the scan lines 122, the data lines 124 and the active devices 126a. In addition, the partition configuration 130 in FIG. 1A is a concave structure. The partition configuration 130 has a width between about 10 µm and 3000 µm and a depth defined according to the depth of the insulation layer 128. The depth of the partition configuration 130 is, for example, between 100 Å and 3000 Å. It is noted that the partition configuration 130 is not limited to a concave structure. FIG. 2A is a local cross-sectional view of an active device array substrate 100' according to another embodiment of the present invention. As shown in FIG. 2A, the partition configuration 130' is a convex structure having a width between 10 µm and 3000 µm and a height between 1.5µ and 4.5 µm, for example.

Figure 2B:
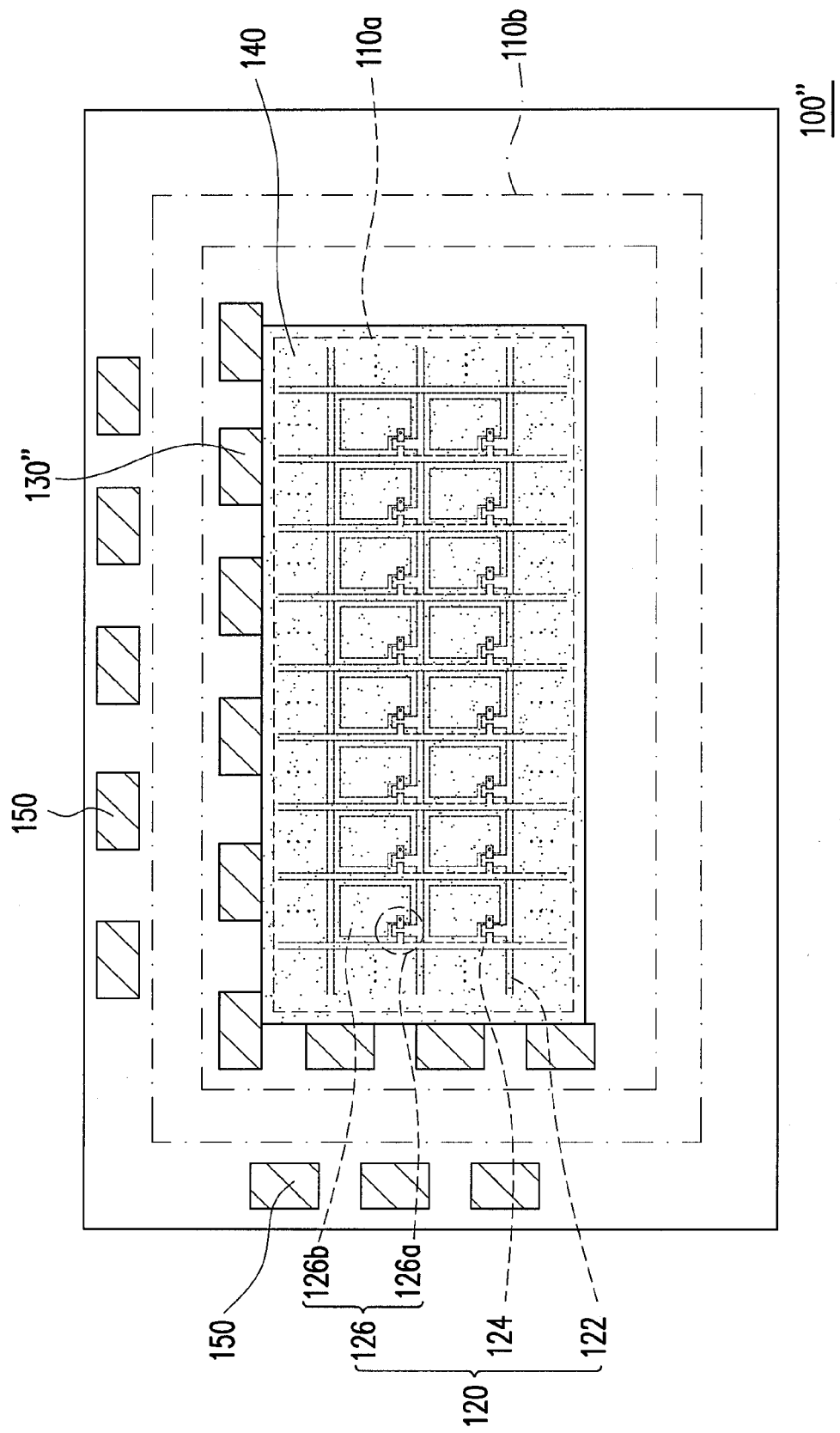

In addition, the active device array substrate 100 further includes at least one common paste 150. The common paste 150 is disposed on the substrate 110 outside the predetermined sealing region 110b and is electrically connected to the pixel array 120. The material constituting the common paste 150 includes, for example, aluminum alloy or other suitable conductive materials. The shortest distance between the common paste 150 and the predetermined sealing region 110b is, for example, greater than or equal to 3000 µm. It should be noted that the pattern of the partition configuration 130 is not limited to a rectangular shape and does not have to surround the alignment region 110a. FIG. 2B is a top view of an active device array substrate 100" according to another embodiment of the present invention. As shown in FIG. 2B, the partition configuration 130" is disposed in various locations between the common paste 150 and the alignment region 110a without completely surrounding the alignment region 110a.

It should be noted that the alignment material layer 140 is fabricated by performing an ink-jet printing process, for example. After the alignment material sprayed onto the alignment region 110a of the substrate 110 is diffused and cured, the alignment material layer 140 is formed. Because the partition configuration 130 is capable of blocking the spread of the alignment material and preventing the alignment material from diffusing into the predetermined sealing region 110b, the alignment material layer 140 will not cover the common paste 150. When the active device array substrate 100 is assembled into a liquid crystal display panel (not shown), the common paste 150 may conduct with the common electrode of the color filter substrate (not shown) through silver paste (not shown), thereby providing a better displaying quality. In other words, the active device array substrate 100 can improve the displaying quality of the liquid crystal display panel. In the following, a method of fabricating an active device array substrate is provided.

Figure 3A:
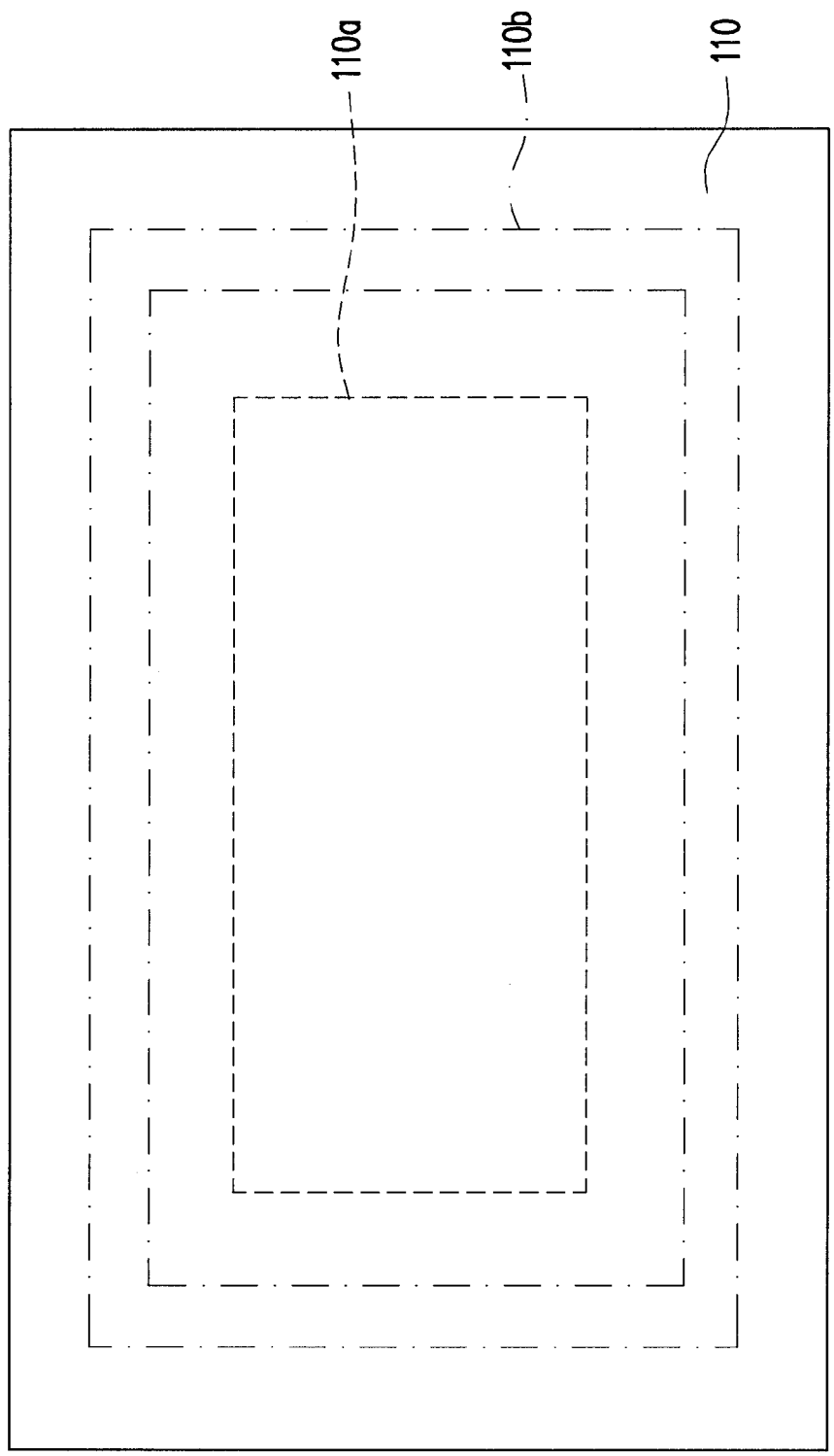
FIGS. 3A through 3F are schematic cross-sectional views showing the steps for fabricating an active device array substrate according to one embodiment of the present invention.

FIGS. 3A through 3F are schematic cross-sectional views showing the steps for fabricating an active device array substrate, according to one embodiment of the present invention. To provide a better explanation of the process of fabricating the active device array substrate, some of the figures have both the cross-sectional view and the top view shown at the same time. First, as shown in FIG. 3A, the method of fabricating the active device array substrate includes providing a substrate 110. The substrate 110 has an alignment region 110a and a predetermined sealing region 110b. The predetermined sealing region 110b surrounds the alignment region 110a.

Figure 3B:
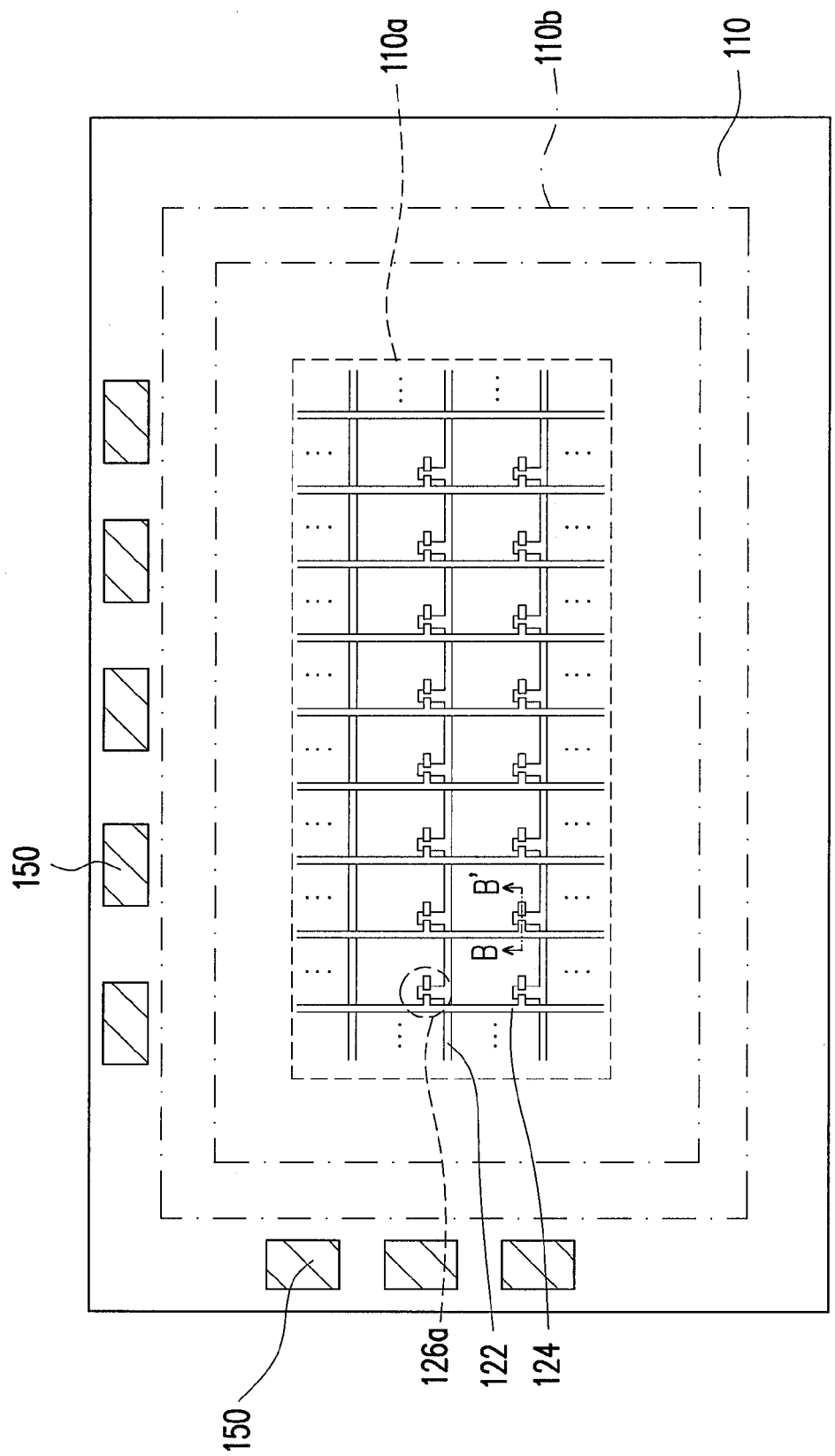

Then, a pixel array 120 is formed on the substrate 110 within the alignment region 110a and a partition configuration 130 is formed between the alignment region 110a and the predetermined sealing region 110b. As shown in FIG. 3B, the process of forming the pixel array 120 and the partition configuration 130 includes forming a plurality of scan lines 122, a plurality of data lines 124 and a plurality of active devices 126a on the substrate 110 within the alignment region 110a and forming at least one common paste 150 on the substrate 110 outside the predetermined sealing region 110b simultaneously. The formation of the scan lines 122, the data lines 124, the active devices 126a and the common paste 150 includes, for example, performing a number of thin film processes, photolithography processes and etching processes. Since the thin film processes, the photolithography processes and the etching processes are conventional techniques, a detailed description of them is omitted.

Figure 3C:
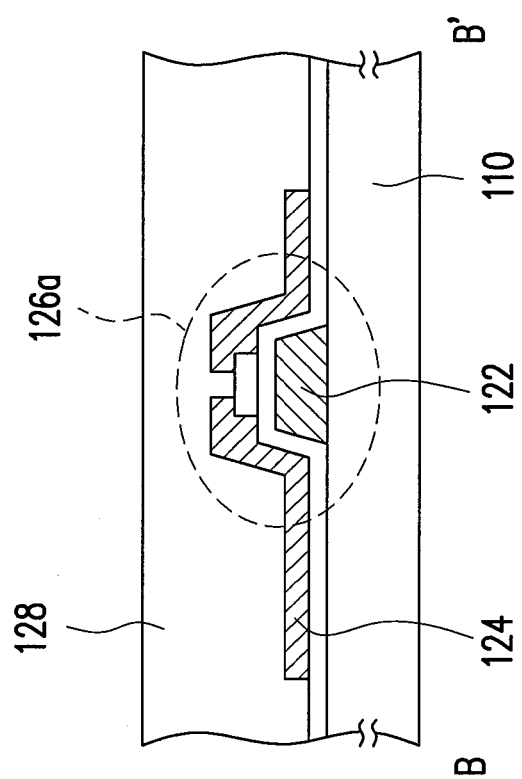

As shown in FIG. 3C, an insulation layer 128 is formed on the substrate 110 to cover the scan lines 122, the data lines 124 and the active devices 126a. The insulation layer is a planarization layer formed, for example, by coating an organic material layer on the substrate 110.

Figure 3D:
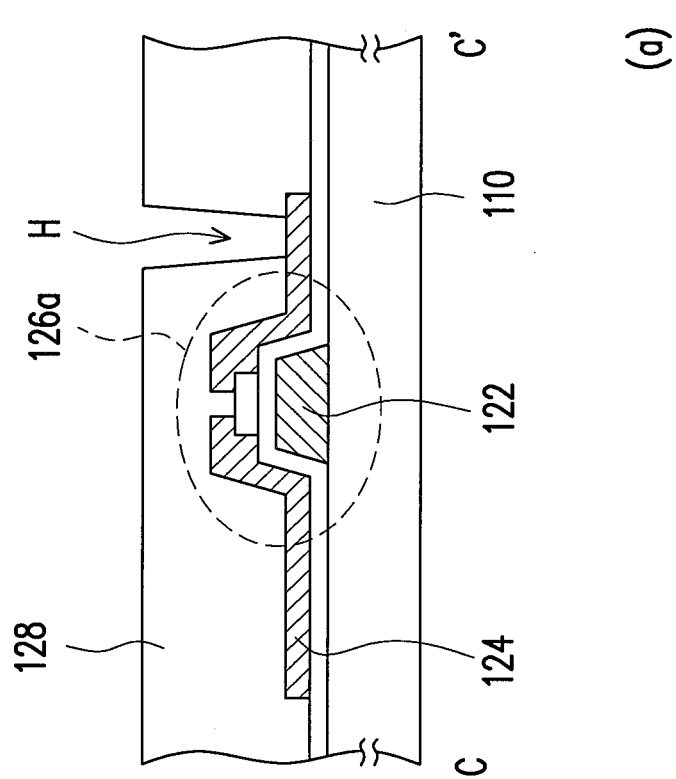
Figure 3D:
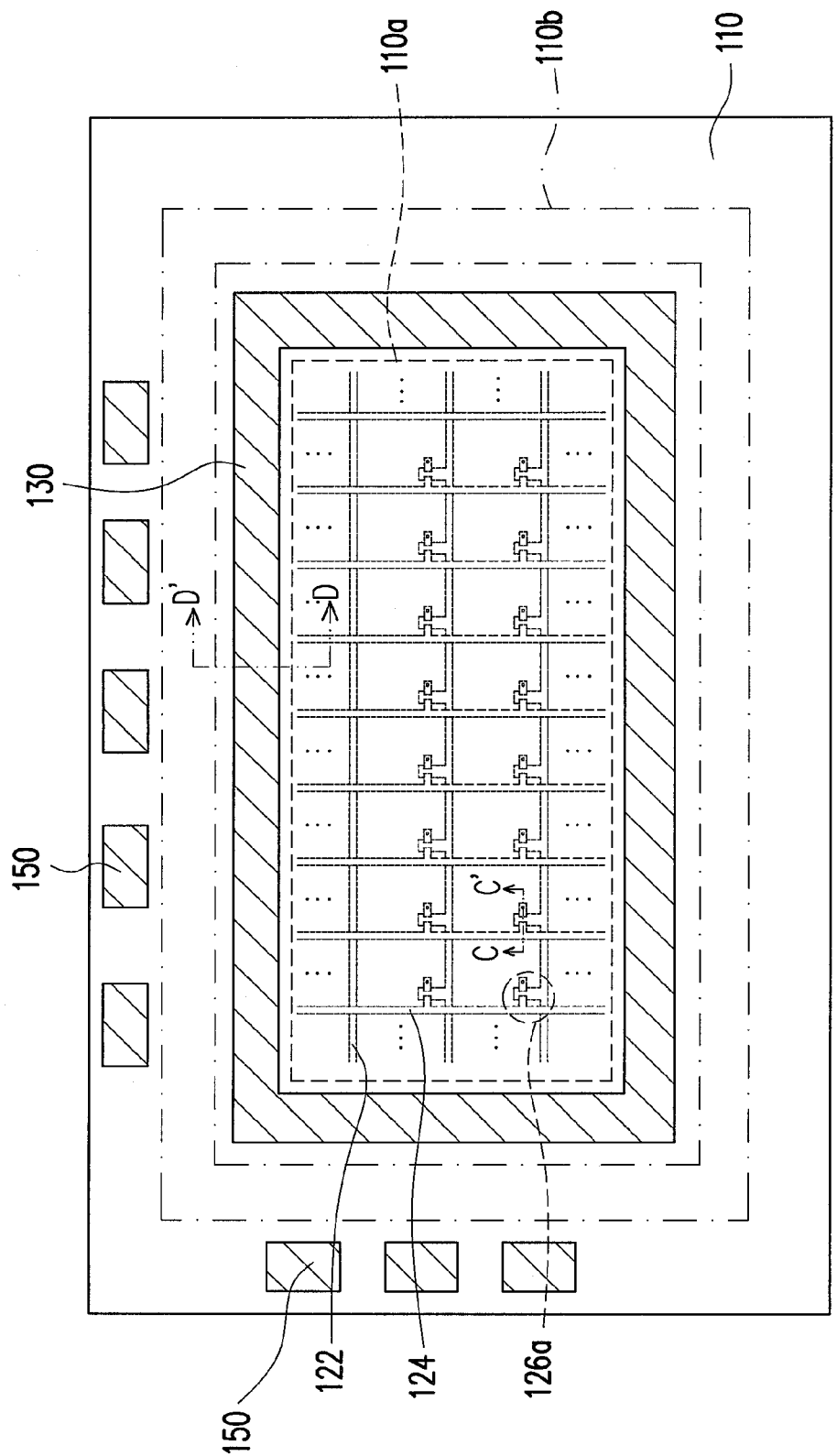

In FIG. 3D, FIG. 3D(b) is a top view of the active device array substrate and FIG. 3D(a) is a cross-sectional view along C-C' and D-D' of FIG. 3D(b). As shown in FIG. 3D, a plurality of contact openings H and a partition configuration 130 are formed in the insulation layer 128. The partition configuration 130 is formed between the common paste 150 and the alignment region 110a. The formation of the contact openings H and the partition configuration 130 includes performing a photolithography process and an etching process. In the present embodiment, the contact openings H and the partition configuration 130 are formed simultaneously.

Figure 3E:
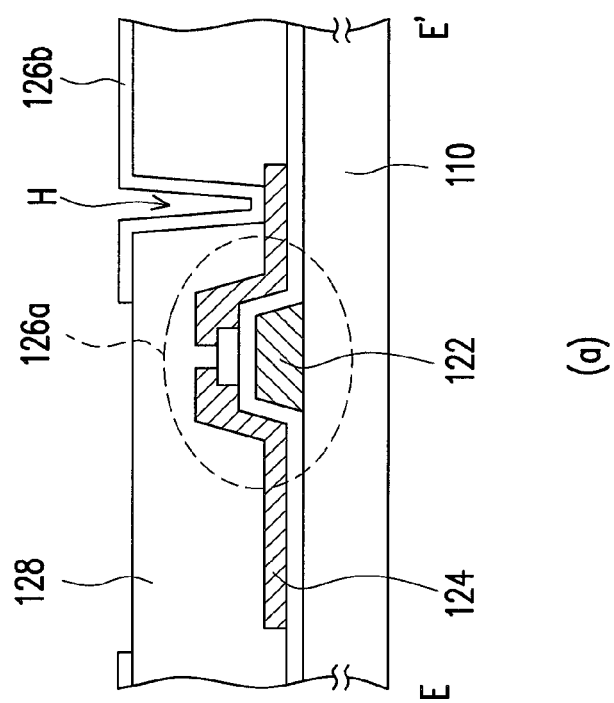
Figure 3E:
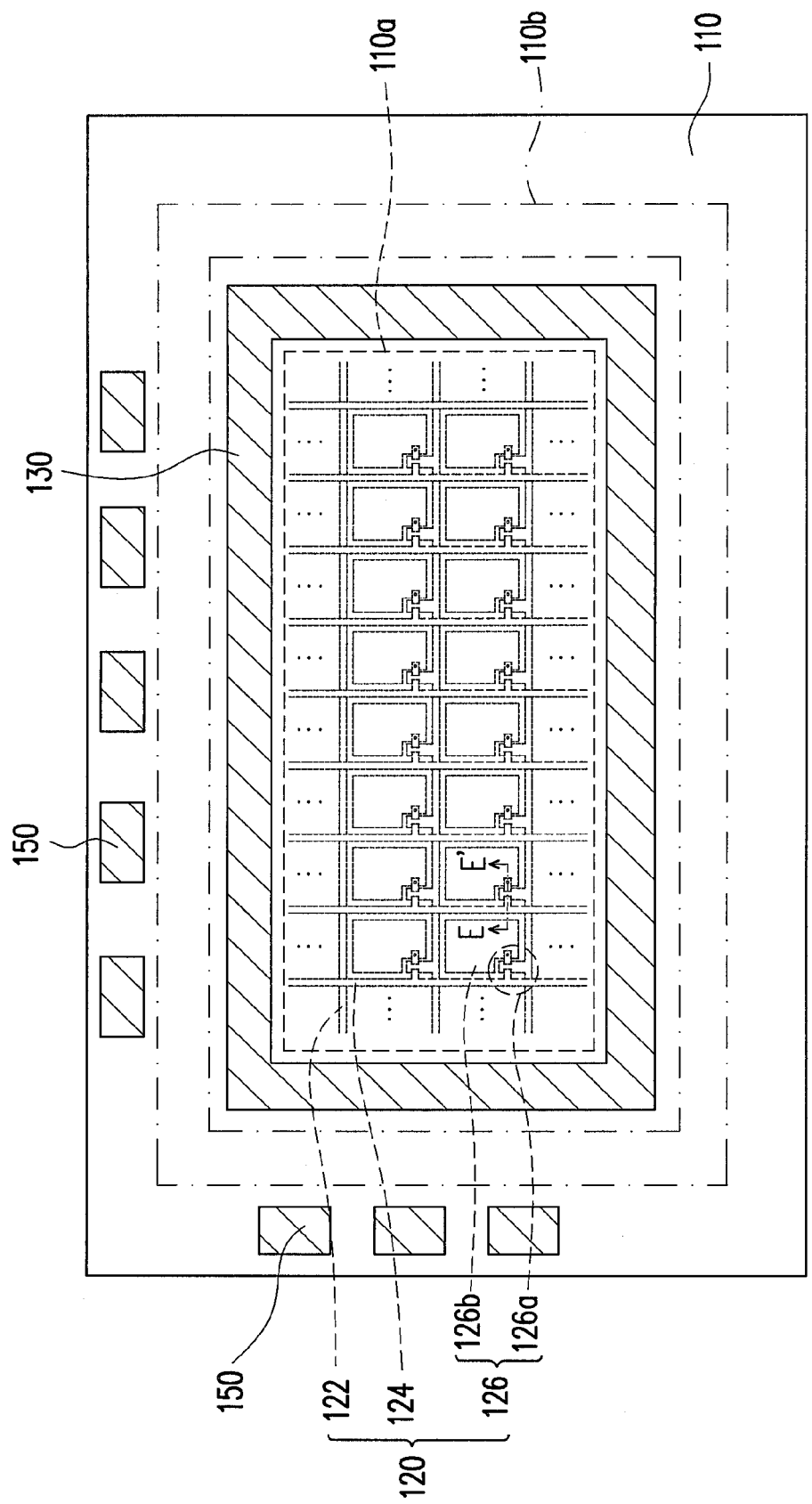

In FIG. 3E, FIG. 3E(b) is a top view of the active device array substrate and FIG. 3E(a) is a cross-sectional view along E-E' of FIG. 3E(b). As shown in FIG. 3E, a plurality of pixel electrodes 126b are formed on the insulation layer 128. Each of the pixel electrodes 126b is electrically connected to one of the active devices 126a through one of the contact openings H. Each active device 126a and its pixel electrode 126b together form a pixel unit 126. The scan lines 122, the data lines 124 and the pixel units 126 together form the pixel array 120. Furthermore, the formation of the pixel electrodes 126b includes, for example, performing a thin film process, a photolithography process and an etching process.

Figure 3F:
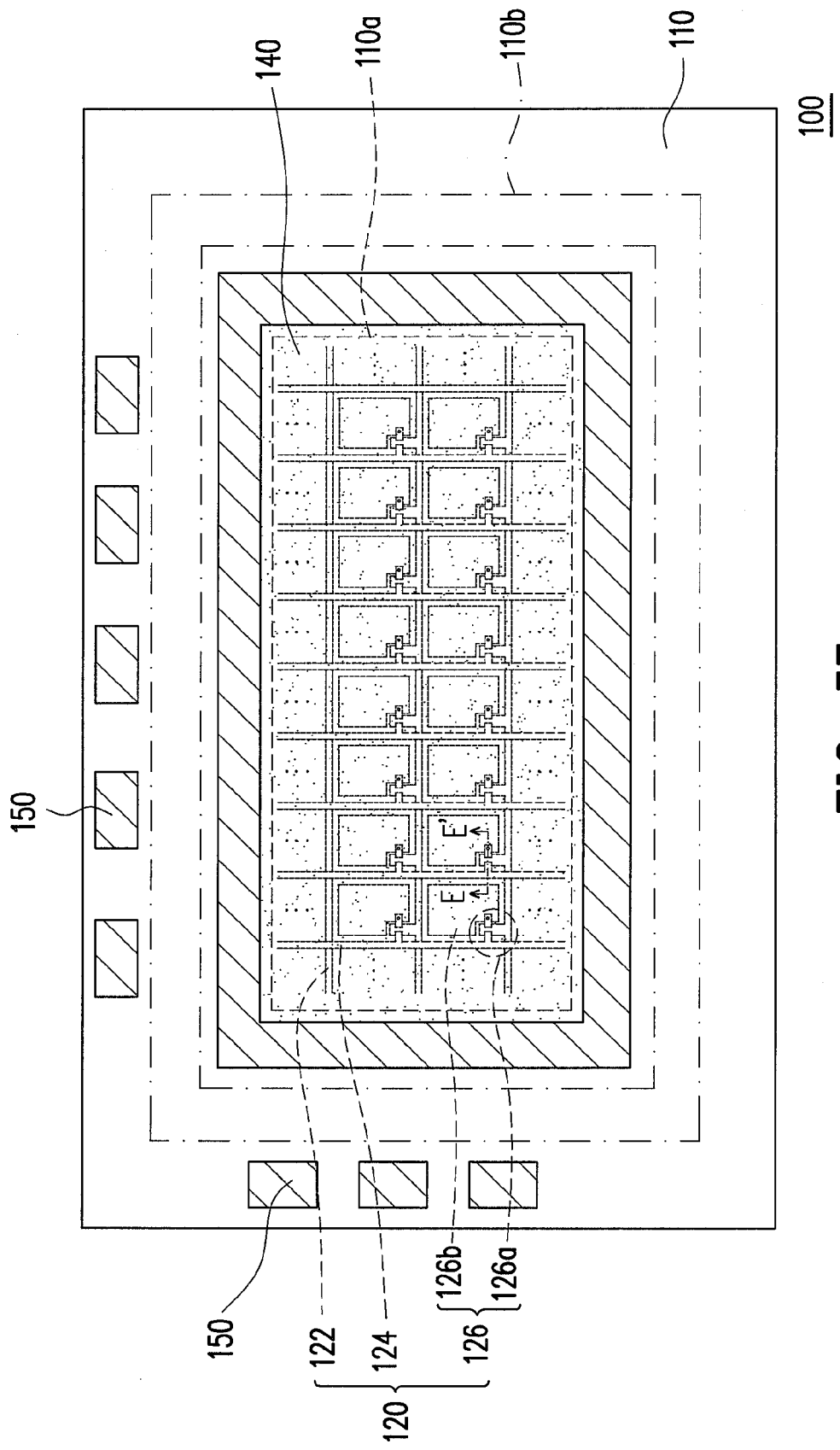

As shown in FIG. 3F, an ink-jet printing process is performed to form an alignment material layer 140 over the substrate 110 within the alignment region 110a to cover the pixel array 120. The method includes, for example, spraying the alignment material over the substrate 110 inside the alignment region 110a. After the alignment material has diffused and cured, an alignment material layer 140 is formed.

After completing the foregoing steps, the active device array substrate 100 is formed. It should be noted that the partition configuration 130 is capable of stopping the spread of the alignment material when forming the alignment material layer 140 so that the alignment material will not diffuse to the predetermined sealing region 110b. Hence, the alignment material layer 140 will not cover the common paste 150. In other words, the method of fabricating the active device array substrate 100 in the present invention can control the region in which the alignment material layer 140 is formed.

The foregoing active device array substrate 100 and a color filter substrate (not shown) may be assembled together to form a liquid crystal display panel (not shown). The common paste 150 may conduct with a common electrode of the color filter substrate through silver paste (not shown) so that the liquid crystal display panel can have an improved displaying quality.

Figure 4A:
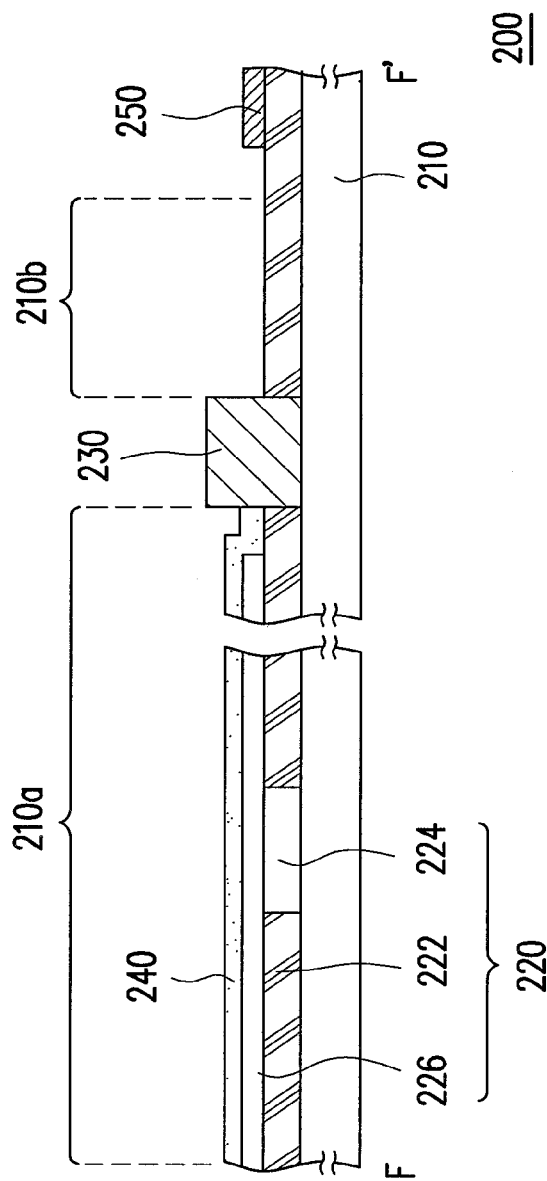
FIG. 4A is a schematic cross-sectional view showing the structure of a color filter substrate according to one embodiment of the present invention.
Figure 4B:
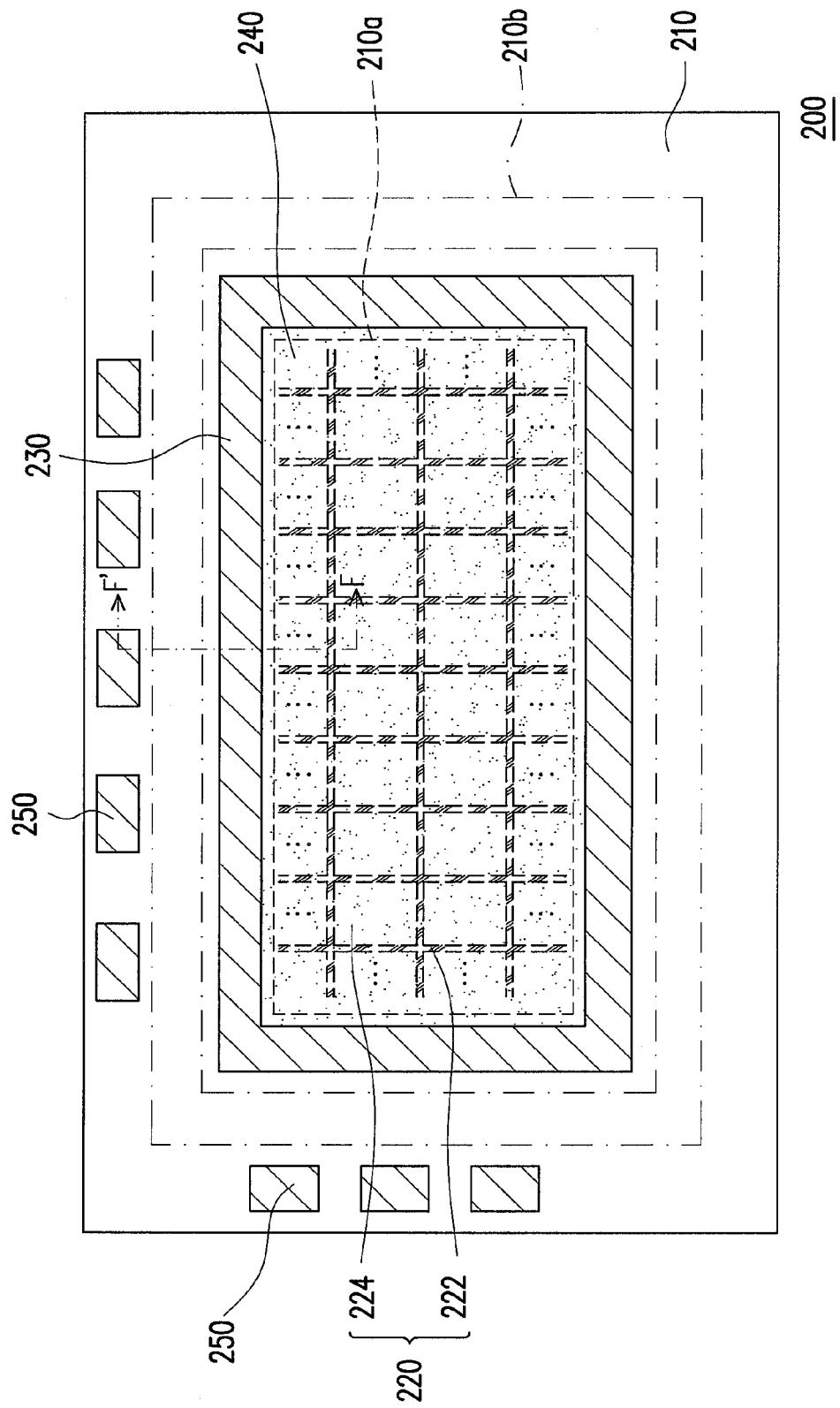
FIG. 4B is a top view of the color filter substrate in FIG. 4A.

FIG. 4A is a schematic cross-sectional view showing the structure of a color filter substrate according to one embodiment of the present invention. FIG. 4B is a top view of the color filter substrate in FIG. 4A. In fact, the color filter substrate in FIG. 4A is a schematic cross-sectional view along line F-F' of FIG. 4B. As shown in FIGS. 4A and 4B, the color filter substrate 200 includes a substrate 210, a color filter array 220, a partition configuration 230 and an alignment material layer 240. The substrate 210 is, for example, a glass substrate, a quartz substrate, or a substrate fabricated using other suitable materials. The substrate 210 has an alignment region 210a and a predetermined sealing region 210b. The predetermined sealing region 210b surrounds the alignment region 210a. The color filter array 220 is disposed on the substrate 210 within the alignment region 210a. The partition configuration 230 is disposed on the substrate 210 between the predetermined sealing region 210b and the alignment region 210a. The alignment material layer 240 is disposed within the alignment region 210a to cover the color filter array 220.

Figure 5A:
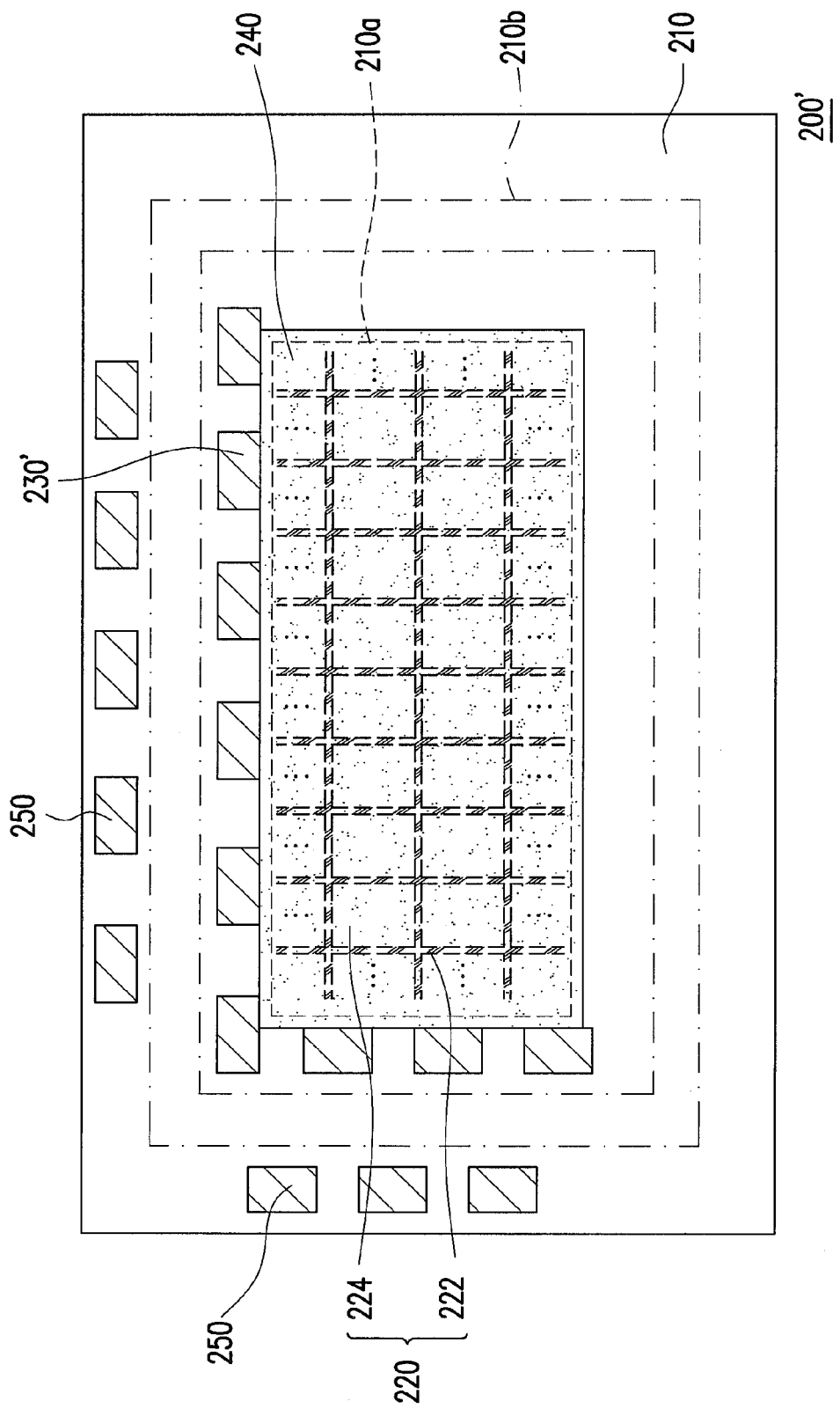
FIGS. 5A and 5B are schematic local cross-sectional view and top view of a color filter substrate according to a different embodiment of the present invention.

In the present embodiment, the color filter substrate 200 further includes at least one common paste 250. The common paste 250 is disposed on the substrate 210 outside the predetermined sealing region 210b. The material constituting the common paste 250 includes, for example, indium tin oxide, indium zinc oxide, metals or other transparent or non-transparent conductive materials. In addition, the shortest distance between the common paste 250 and the predetermined sealing region 210b is greater than or equal to 3000 μm. It should be noted that the pattern of the partition configuration 230 is not limited to a rectangular shape and does not have to completely surround the alignment region 210a. FIG. 5A is a top view of a color filter substrate 200' according to another embodiment of the present invention. As shown in FIG. 5A, the partition configuration 230' is disposed in various locations between the common paste 250 and the alignment region 210a without completely surrounding the alignment region 210a.

More specifically, the color filter array 220 includes a black matrix layer 222, a plurality of color filter patterns 224 and a common electrode layer 226. The color filter patterns 224 are disposed between the patterns of the black matrix layer 222. The common electrode layer 226 covers the black matrix layer 222 and the color filter patterns 224 and is electrically connected to the common paste 250. The material constituting the black matrix layer 222 includes, for example, black resin or other suitable materials. The color filter patterns 224 include, for example, red filter patterns, green filter patterns and blue filter patterns. The material constituting the common electrode layer 226 includes, for example, indium tin oxide, indium zinc oxide, or other transparent conductive material. The material constituting the partition configuration 230 may be identical to that of the black matrix layer 222.

Figure 5B:
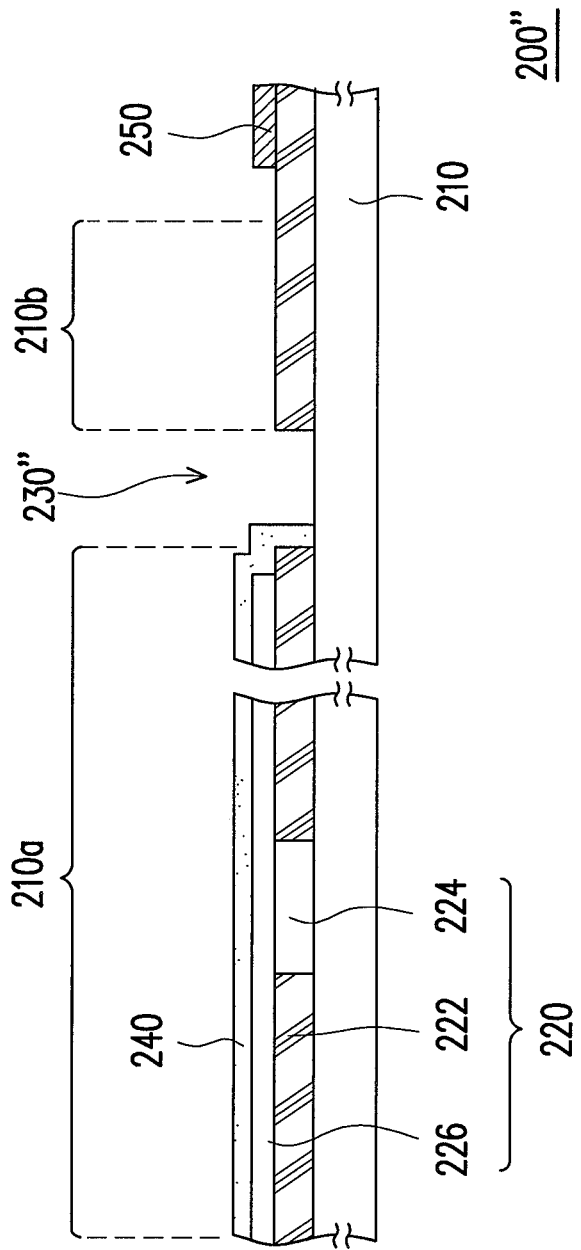

In the present embodiment, the partition configuration 230 is a convex structure having a width between about 10 μm and 3000 μm and a height between about 1.5 μm and 4.5 μm. However, the partition configuration 230 is not limited to a convex structure. FIG. 5B is schematic local cross-sectional view of a color filter substrate according to another embodiment of the present invention. As shown in FIG. 5B, the partition configuration 230" has a concave structure.

In a similar way to the aforementioned active device array substrate 100, the partition configuration 230 can be used to stop the spread of the alignment material when an ink-jet printing process is performed to form the alignment material layer 240. Hence, the alignment material layer 240 is formed within the alignment region 210a and the alignment material layer 240 will not cover the common paste 250. When the color filter substrate 200 is assembled into a liquid crystal display panel (not shown), the common paste 250 may electrically conduct with the pixel array on the active device array substrate (not shown) through the silver paste, thereby improving the displaying quality of the liquid crystal display panel. In other words, the color filter substrate 200 can improve the displaying quality of the liquid crystal display panel. In the following, the method of fabricating the color filter substrate is explained.

Figure 6A:
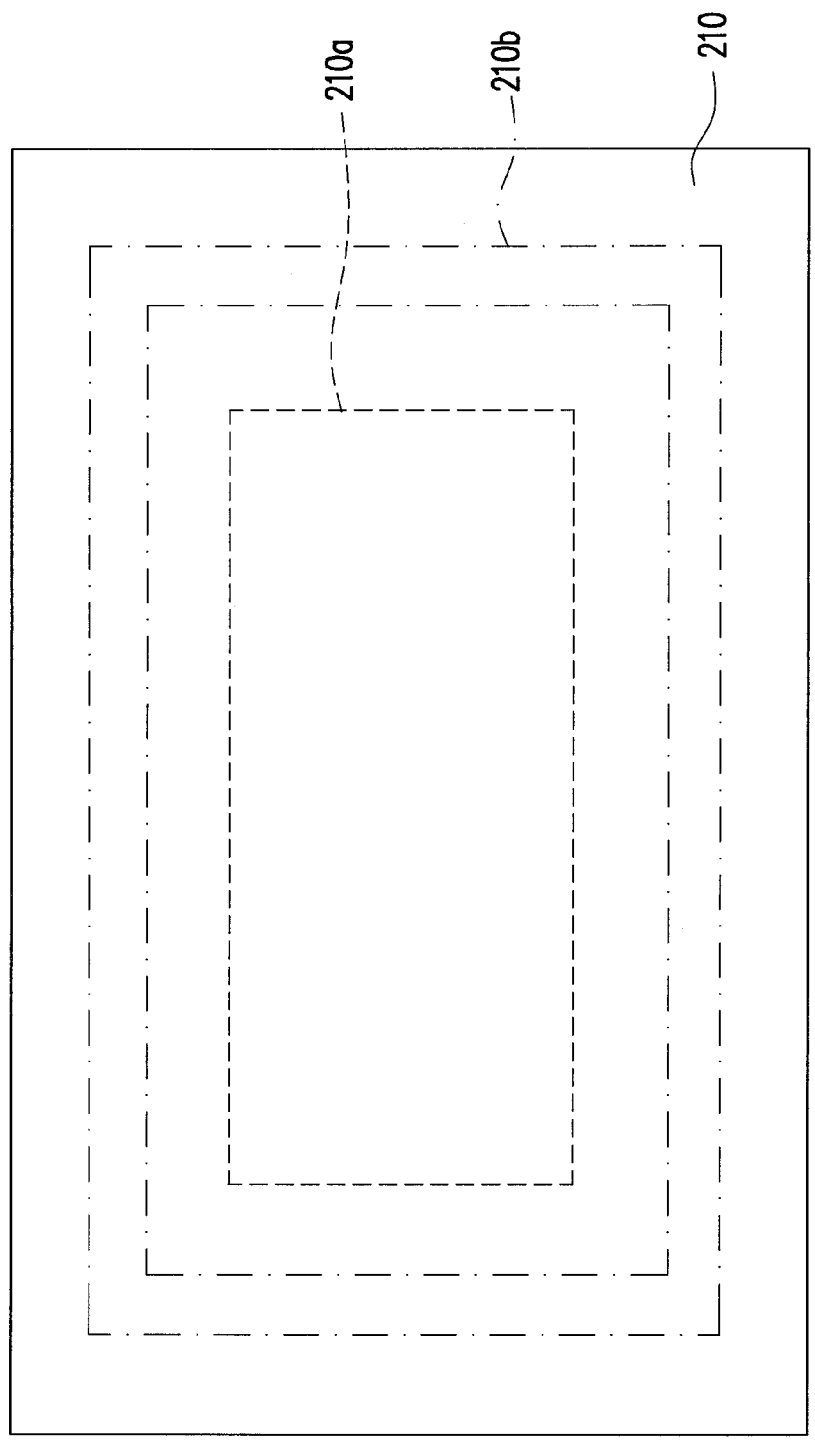
FIGS. 6A through 6E are schematic cross-sectional views showing the steps for fabricating a color filter substrate according to one embodiment of the present invention.

FIGS. 6A through 6E are schematic cross-sectional views showing the steps for fabricating a color filter substrate according to one embodiment of the present invention. To provide a better explanation of the process of fabricating the color filter substrate, some of the figures have both the cross-sectional view and the top view shown at the same time. The method of forming the color filter substrate includes the following steps. First, as shown in FIG. 6A, a substrate 210 is provided. The substrate 210 has an alignment region 210a and a predetermined sealing region 210b. The predetermined sealing region 210b surrounds the alignment region 210a.

Figure 6B:
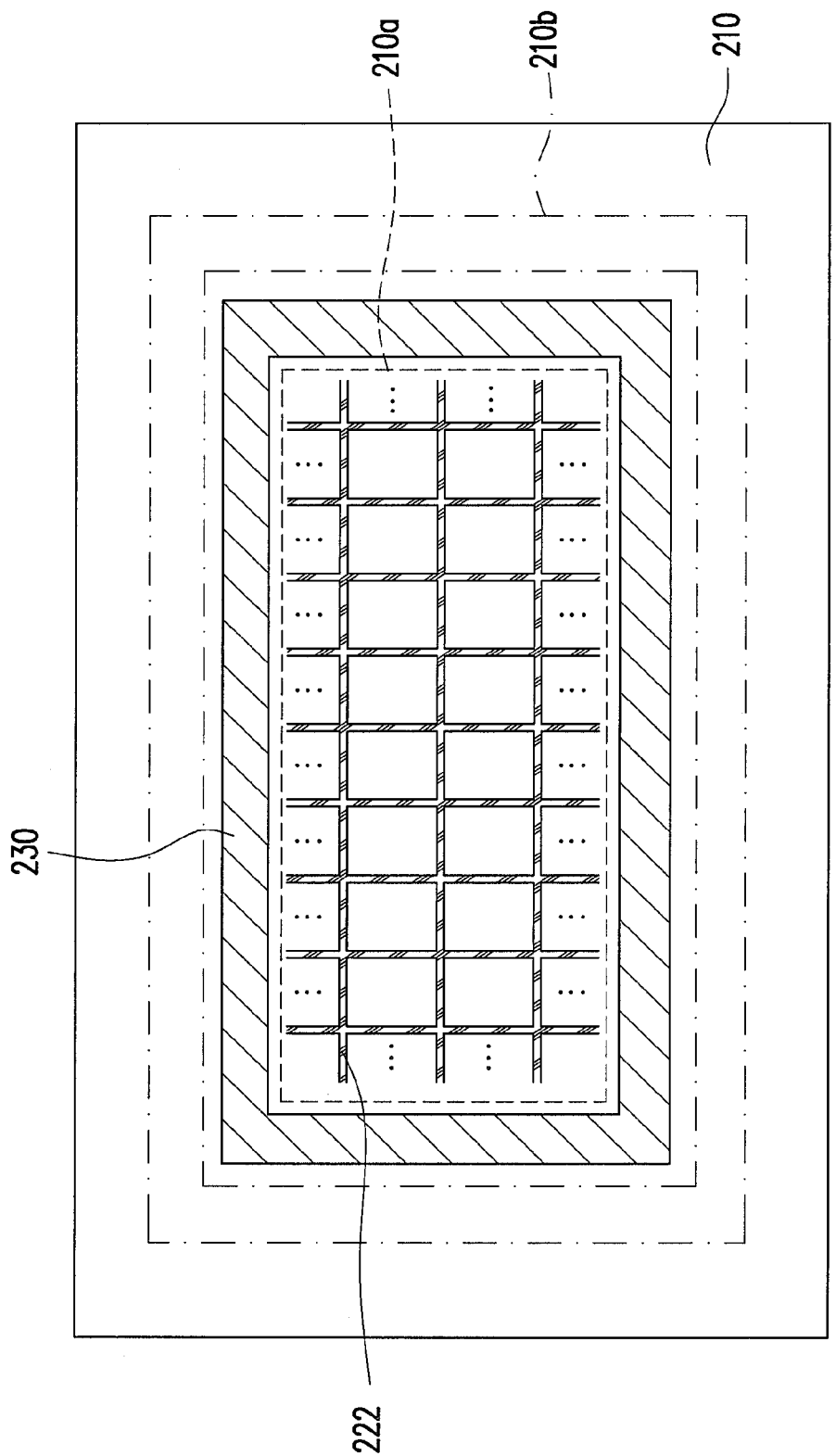

Next, a color filter array 220 is formed on the substrate 210 within the alignment region 210a and a partition configuration 230 is formed between the alignment region 210a and the predetermined sealing region 210b. As shown in FIG. 6B, the formation of the color filter array 220 and the partition configuration 230 includes forming a black matrix layer 222 on the substrate 210 inside the alignment region 210a and a partition configuration 230 between the alignment region 210a and the predetermined sealing region 210b. It should be noted that, in the present embodiment, the black matrix layer 222 and the partition configuration 230 are fabricated using an identical material and formed simultaneously. The formation of the black matrix layer 222 and the partition configuration 230 simultaneously includes coating a layer of photosensitive resin over the substrate 210 and then using a halftone mask to perform an exposure. Afterward, the exposed photosensitive resin is developed to form the black matrix layer 222 and the partition configuration 230 simultaneously.

Figure 6C:
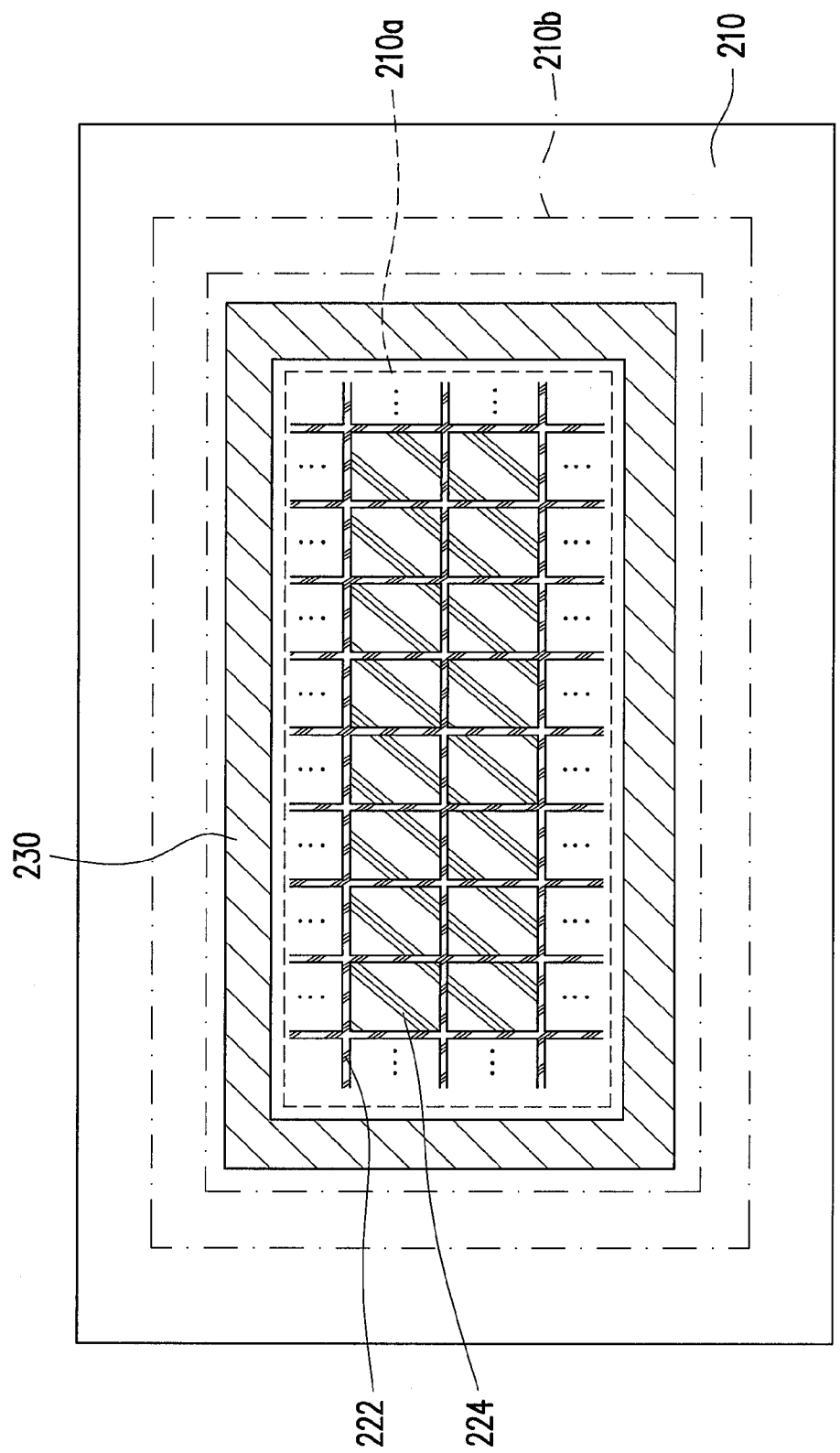

As shown in FIG. 6C, a plurality of color filter patterns 224 are formed between the patterns of the black matrix layer 222.

Figure 6D:
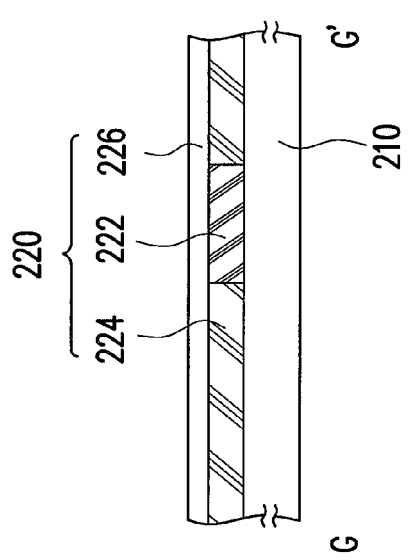
Figure 6D:
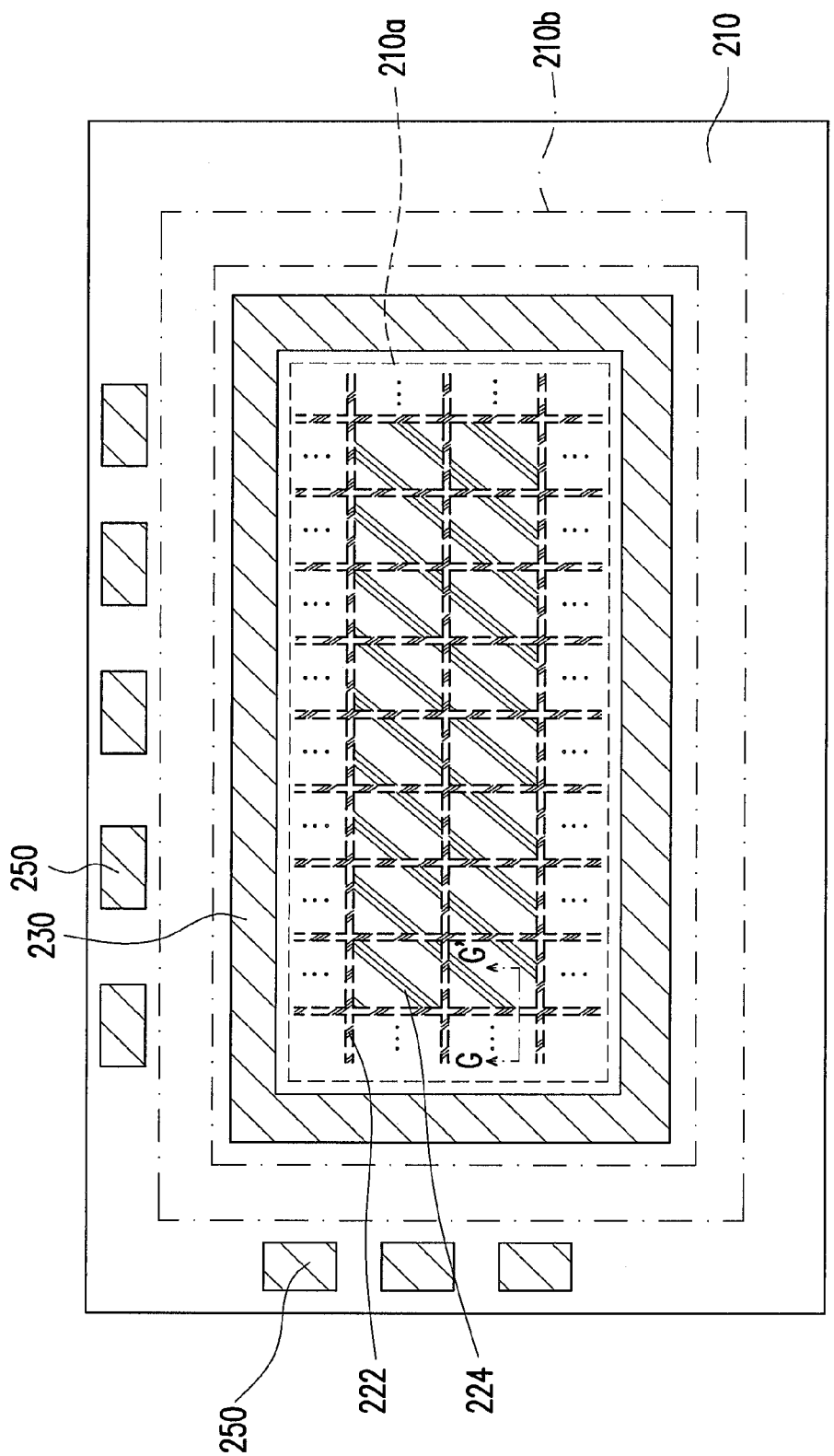

As shown in FIG. 6D, a common electrode layer 226 is formed over the substrate 210 to cover the black matrix layer 222 and the color filter patterns 224 and form at least one common paste 250 on the substrate 210 outside the predetermined sealing region 210b. In other words, the partition configuration 230 is located between the common paste 250 and the alignment region 210a. The common electrode layer 226, the black matrix layer 222 and the color filter patterns 224 together form a color filter array 220.

Figure 6E:
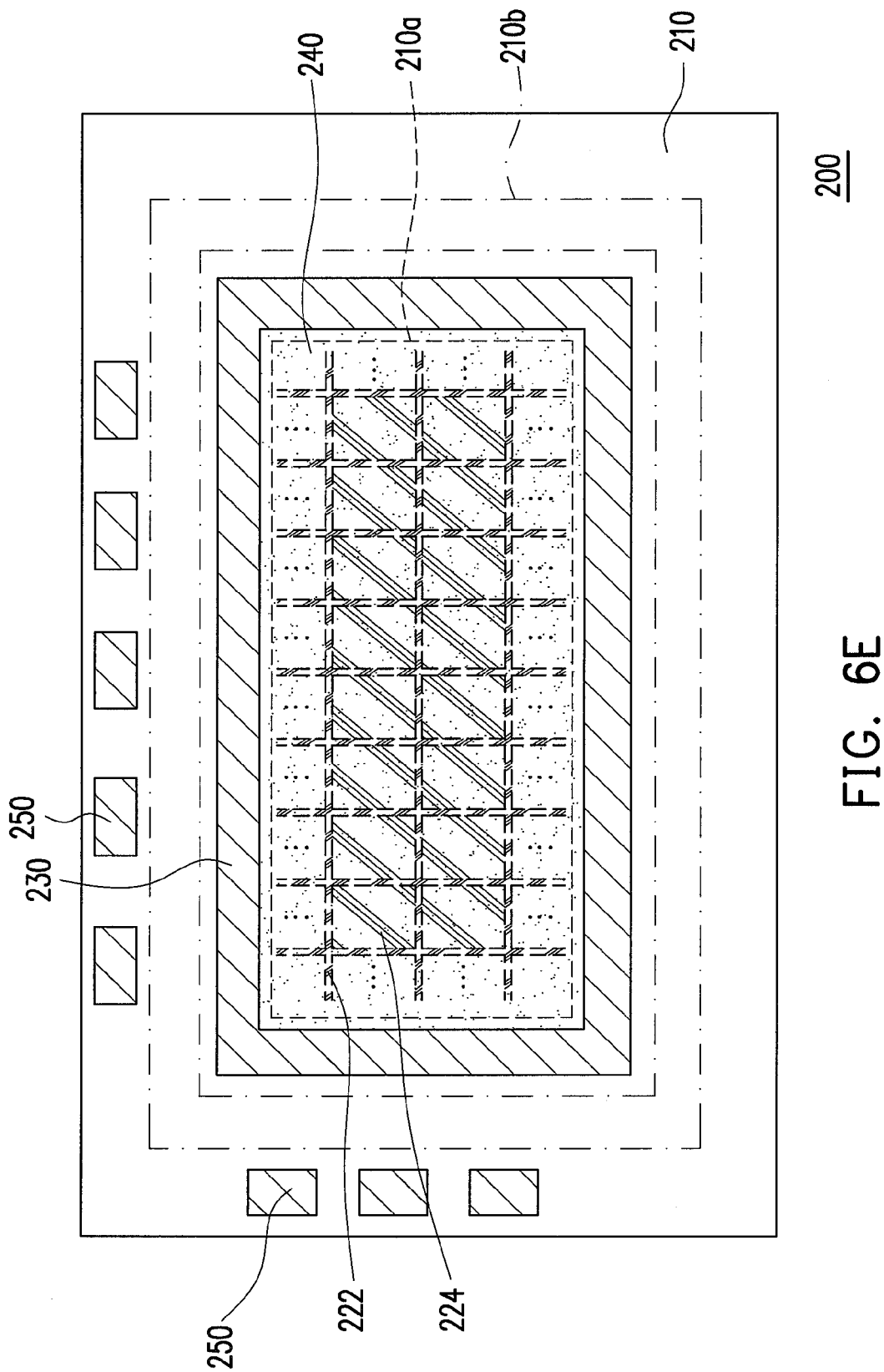

As shown in FIG. 6E, an ink jet printing process is performed to form an alignment material layer 240 over the substrate 210 within the alignment region 210a such that the color filter array 220 is also covered. The formation of the alignment material layer 240 includes spraying alignment material into the alignment region 210a of the substrate 210. After diffusing and curing the alignment material, the alignment material layer 240 is formed.

After completing the foregoing steps, the color filter substrate 200 is formed. It should be noted that the partition configuration 230 is capable of stopping the spread of the alignment material when forming the alignment material layer 240 so that the alignment material will not diffuse to the predetermined sealing region 210b. Hence, the alignment material layer 240 will not cover the common paste 250. In other words, the method of fabricating the color filter array substrate 200 in the present invention can control the region in which the alignment material layer 240 is formed. Furthermore, the color filter substrate 200 and an active array substrate (not shown) may be assembled to form a liquid crystal display panel (not shown). The common paste 250 conducts with the common electrode on the active device array substrate through silver paste (not shown) so that the displaying quality of the liquid crystal display panel is improved.

Although the black matrix layer 222 and the partition configuration 230 are simultaneously formed in the present embodiment, it is not necessary to form the partition configuration and the black matrix layer 222 at the same time. Moreover, the material constituting the partition configuration 230 need not be identical to the one constituting the black matrix layer 222. In another embodiment, the partition configuration 230 and the color filter patterns 224 are formed simultaneously and the material constituting the partition configuration 230 may be identical to the one constituting the color filter patterns 224.

In summary, the fabricating method of the active device array substrate and the color filter substrate according to the present invention has at least the following advantages:

1. In the active device array substrate and the color filter substrate of the present invention, the partition configuration restricts the region in which the alignment material is formed so that the alignment material layer will not cover the common paste. When the active device array substrate or the color filter substrate is assembled into a liquid crystal display panel with a counter substrate, the circuits on the two substrates electrically conduct through the common paste and provide a better displaying quality. Thus, the active device array substrate and color filter substrate can improve the displaying quality of the liquid crystal display panel.

2. The method of fabricating the active device array substrate or the method of fabricating the color filter substrate in the present invention includes the process of forming the partition configuration. The partition configuration prevents the alignment material layer from covering the common paste in the process of forming the alignment material layer.

3. The method of fabricating the active device array substrate or the method of fabricating the color filter substrate in the present invention is compatible with existing manufacturing processes. Since only the layout of one of the masks needs to be modified, no additional equipment is required.

It will be apparent to those skilled in the art that various modifications and variations can be made to the structure of the present invention without departing from the scope or spirit of the invention. In view of the foregoing, it is intended that the present invention covers modifications and variations thereof, provided they fall within the scope of the following claims.

What is claimed is:

1. An active device array substrate, comprising:
a substrate having an alignment region and a predetermined sealing region, wherein the predetermined sealing region surrounds the alignment region;
a pixel array disposed on the substrate within the alignment region;
a partition configuration disposed on the substrate, wherein the partition configuration is located between the predetermined sealing region and the alignment region and the partition configuration is a convex structure having a width between about 10 μm and 3000 μm and a height between about 1.5 μm and 4.51 μm;
an alignment material layer disposed inside the alignment region to cover the pixel array;
a common paste disposed on the substrate, electrically connected to the pixel array and the predetermined sealing region being between the partition configuration and the common paste, wherein a projection area of the common paste on the substrate is independent from the predetermined sealing region and a projection area of the partition configuration; and
wherein the common paste conducts with a common electrode of a color filter substrate via a silver paste and the active device array substrate and the color filter substrate are assembled together to formed a display panel.

2. The active device array substrate of claim 1, wherein the material of the common paste includes aluminum alloy, indium tin oxide, indium zinc oxide, metal or other transparent or non-transparent conductive materials.

* * * * *